United States Patent
Zhang et al.

(10) Patent No.: US 6,566,753 B2
(45) Date of Patent: *May 20, 2003

(54) COMPOSITE IRIDIUM BARRIER STRUCTURE WITH OXIDIZED REFRACTORY METAL COMPANION BARRIER

(75) Inventors: Fengyan Zhang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/115,394

(22) Filed: Apr. 2, 2002

(65) Prior Publication Data

US 2002/0135067 A1 Sep. 26, 2002

Related U.S. Application Data

(62) Division of application No. 09/316,646, filed on May 21, 1999, now Pat. No. 6,399,521.

(51) Int. Cl.[7] .................. H01L 29/76; H01L 29/94; H01L 27/108; H01L 29/22; H01L 31/062
(52) U.S. Cl. .............. 257/751; 257/758; 257/700; 257/701; 257/295; 257/757; 257/761; 257/763; 257/768; 257/303; 257/296; 257/306; 257/310
(58) Field of Search .................. 257/757, 751, 257/761, 763, 295, 310, 768, 303, 296, 753, 306, 700, 701, 758

(56) References Cited

U.S. PATENT DOCUMENTS

| | | | | |
|---|---|---|---|---|
| 6,011,284 A | * | 1/2000 | Katori et al. ............... | 257/295 |
| 6,180,447 B1 | * | 1/2001 | Park et al. .................. | 438/240 |
| 6,198,119 B1 | * | 3/2001 | Nabatame et al. .......... | 257/295 |
| 6,236,113 B1 | * | 5/2001 | Zhang et al. ............... | 257/757 |
| 6,281,537 B1 | * | 8/2001 | Kim ........................... | 257/295 |
| 6,288,420 B1 | * | 9/2001 | Zhang et al. ............... | 257/295 |
| 6,320,213 B1 | * | 11/2001 | Kirlin et al. ................ | 257/295 |
| 2001/0050391 A1 | * | 12/2001 | Matsuno et al. ........... | 257/306 |

* cited by examiner

Primary Examiner—Alexander O. Williams
(74) Attorney, Agent, or Firm—David C. Ripma; Matthew D. Rabdau; Scott C. Krieger

(57) ABSTRACT

An Ir—M—O composite film has been provided that is useful in forming an electrode of a ferroelectric capacitor, where M includes a variety of refractory metals. The Ir combination film effectively prevents oxygen diffusion, and is resistant to high temperature annealing in oxygen environments. When used with an underlying barrier layer made from oxidizing the same variety of M transition metals, the resulting conductive barrier also suppresses the diffusion of Ir into any underlying Si substrates. As a result, Ir silicide products are not formed, which degrade the electrode interface characteristics. The Ir combination film remains conductive, not peeling or forming hillocks, during high temperature annealing processes, even in oxygen. The Ir—M—O conductive electrode/barrier structures are useful in nonvolatile MFMIS (metal/ferro/metal/insulator/silicon) memory devices, DRAMs, capacitors, pyroelectric infrared sensors, optical displays, and piezoelectric transducers. A method for forming an Ir—M—O composite film barrier layer with an oxidized refractory metal barrier layer is also provided.

10 Claims, 2 Drawing Sheets

Ir-Ta-O/Ta-Ta$_2$O$_5$/SiO$_2$ AFTER 800°C 90 MIN OXYGEN ANNEALING, SHEET RESISTANCE IS ABOUT 25 ohm/square

COMPOSITE IRIDIUM BARRIER STRUCTURE WITH OXIDIZED REFRACTORY METAL COMPANION BARRIER

CROSS REFERENCE TO RELATED APPLICATION

This application is a divisional of application Ser. No. 09/316,646, filed May 21, 1999, entitled "Composite Iridium Barrier Structure With Oxidized Refractory Metal Companion Barrier and Method for Same," invented by Fengyan Zhang et al., now U.S. Pat. No. 6,399,521.

BACKGROUND AND SUMMARY OF THE INVENTION

The present invention is generally related to the fabrication of integrated circuits (ICs) and, more specifically, to the fabrication of a highly stable conductive electrode barrier using an iridium (Ir) composite film with an adjacent barrier including an oxidized transition, or refractory metal.

Platinum (Pt) and other noble metals are used in IC ferroelectric capacitors. The use of noble metals is motivated by their inherent chemical resistance. This property is especially desirable under high temperature oxygen annealing conditions, such as those seen in the fabrication of ferroelectric capacitors. In addition, chemical interaction between noble metals and ferroelectric materials such as perovskite metal oxides, is negligible.

The above-mentioned noble metals are used as conductive electrode pairs separated by a ferroelectric material. One, or both of the electrodes are often connected to transistor electrodes, or to electrically conductive traces in the IC. As is well known, these ferroelectric devices can be polarized in accordance with the voltage applied to the electrode, with the relationship between charge and voltage expressed in a hysteresis loop. When used in memory devices, the polarized ferroelectric device can be used to represent a "1" or a "0". These memory devices are ferro-RAM (FeRAM) and metal ferroelectric metal insulator silicon (MFMIS) transistors. Ferroelectric devices are nonvolatile. That is, the device remains polarized even after power is removed from the IC in which the ferroelectric is imbedded.

There are problems in the use of metal, even noble metal electrodes. Pt, perhaps the widely used noble metal, permits the diffusion of oxygen, especially during high temperature annealing processes. The diffusion of oxygen through Pt results in the oxidation of the neighboring barrier and substrate material. Typically, the neighboring substrate material is silicon or silicon dioxide. Oxidation can result in poor adhesion between the Pt and neighboring layer. Oxidation can also interfere with the conductivity between neighboring substrate layers. Silicon substrates are especially susceptible to problems occurring as a result of oxygen diffusion. The end result may be a ferroelectric device with degraded memory properties. Alternately, the temperature of the IC annealing process must be limited to prevent the degradation of the ferroelectric device.

Various strategies have been attempted to improve the interdiffusion, adhesion, and conductivity problems associated with the use of noble metals as a conductive film in IC fabrication. Titanium (Ti), titanium oxide ($TiO_2$), and titanium nitride (TiN) layers have been interposed between a noble metal and silicon (Si) substrates to suppress the interdiffusion of noble metal into Si, and to enhance adhesion between layers. However, Ti layers are generally only effective below annealing temperatures of 600 degrees C. After a 600 degree C. annealing, Pt diffuses through the Ti layer to react with silicon, forming a silicide product. Further, the Pt cannot stop the oxygen diffusion. After a high temperature annealing, a thin layer of silicon oxide may be formed on the silicon surface, which insulates contact between silicon and the electrode.

Other problems associated with the annealing of a Pt metal film are peeling and hillock formation. Both these problems are related to the differences in thermal expansion and stress of Pt with neighboring IC layers during high temperature annealing. A layer of Ti overlying the Pt film is known to reduce stress of the Pt film, suppressing hillock formation.

Ir has also been used in attempts to solve the oxygen interdiffusion problem. Ir is chemically stable, having a high melting temperature. Compared to Pt, Ir is more resistant to oxygen diffusion. Further, even when oxidized, iridium oxide remains conductive. When layered next to Ti, the Ir/Ti barrier is very impervious to oxygen interdiffusion. However, Ir reacts with Ti. Like Pt, Ir is also very reactive with silicon or silicon dioxide. Therefore, a bilayered Ir/Ti or Ir/TiN barrier is not an ideal barrier metal.

Co-pending application Ser. No. 09/263,595, entitled "Iridium Conductive Electrode/Barrier Structure and Method for Same", invented by Zhang et al., and filed on Mar. 5, 1999, discloses a multilayered Ir/Ta film that is resistant to interdiffusion.

Co-pending application Ser. No. 09/263,970, entitled "Iridium Composite Barrier Structure and Method for Same", invented by Zhang et al., and filed on Mar. 5, 1999, discloses a Ir composite film that is resistant to interdiffusion.

Co-pending application Ser. No. 09/316,661, entitled "Composite Iridium-Metal-Oxygen Barrier Structure with Refractory Metal Companion Barrier and Method for Same," invented by Zhang et al., and filed on May 21, 1999, now U.S. Pat. No. 6,190,963, discloses an Ir composite film that is resistant to interdiffusion.

It would be advantageous if alternate methods were developed for the use of Ir as a conductor, conductive barrier, or electrode in IC fabrication. It would be advantageous if the Ir could be used without interaction to an underlying Si substrate.

It would be advantageous if an Ir film could be altered with other conductive metals to improve interdiffusion properties. Further, it would be advantageous if this improved type of Ir film could be layered with an interposing film to prevent the interaction of Ir with a silicon substrate.

It would be advantageous if the barrier interposed between the Ir composite film and the silicon substrate could be used as the gate dielectric of a transistor.

It would be advantageous if the above-mentioned Ir-metal film could resist the interdiffusion of oxygen at high annealing temperatures. It would also be advantageous if the Ir-metal film was not susceptible to peeling problems and hillock formation.

It would be advantageous if the Ir-metal film could be produced which remains electrically conductive after annealing at high temperatures and oxygen ambient conditions.

Accordingly, a highly temperature stable conductive barrier layer for use in an integrated circuit is provided. The barrier comprises an underlying silicon substrate, a first barrier film including an oxidized refractory metal barrier overlying the substrate, and an iridium-refractory metal-oxygen (Ir—M—O) composite film overlying the first barrier film. The refractory metal is used to help stuff the grain boundaries of Ir polycrystals, improving structural stability.

Typically, the first barrier film is selected from the group of materials consisting of $TiO_2$, $Ta_2O_5$, $Nb_2O_5$, $ZrO_2$, $Al_2O_3$, and $HfO_2$. The first barrier layer has a thickness in the range of approximately 2 to 100 nanometers (nm). The first barrier is used as a barrier to separate the silicon substrate from the bottom electrode Ir composite film. It also acts as a gate dielectric in a metal ferroelectric metal insulator silicon (MFMIS) memory.

The Ir—M—O composite film remains conductive after high temperature annealing processes in an oxygen environment. Further, the Ir—M composite film resists hillock formation, and resists peeling. Specifically, the Ir composite film includes the following materials: Ir—Ta—O, Ir—Ti—O, Ir—Nb—O, Ir—Al—O, Ir—Zr—O, and Ir—Hf—O. Typically, the Ir—M—O composite film has a thickness in the range of approximately 10 to 500 nm.

In some aspects of the invention, the barrier is used to form an electrode in a ferroelectric device. Then, a ferroelectric film overlies the Ir—M—O film. A conductive metal film made of a noble metal, the above-mentioned Ir—M composite film, or multilayered conductive top electrode overlies the ferroelectric film. The ferroelectric film is capable of storing charges between the top and Ir—M—O electrodes.

Also provided is a method for forming a highly temperature stable conductive barrier overlying an integrated circuit substrate. The method comprising the steps of:

a) through PVD, CVD, or MOCVD processes, forming a first barrier layer, as described above, overlying the substrate;

b) through PVD, CVD, and MOCVD processes, forming a first composite film including iridium and oxygen, as described above, overlying the first barrier layer to a thickness in the range of approximately 10 to 500 nm; and c) annealing the first composite film in an atmosphere selected from the group of gases consisting of oxygen, $N_2$, Ar, and a vacuum, and in which the annealing temperature is in the range of approximately 400 to 1000 degrees C., whereby the conductivity of the first composite film is improved and the thickness of the first composite film is stabilized.

In some aspects of the invention, wherein a ferroelectric capacitor is formed, a further step follows Step b), of:

d) depositing a ferroelectric material overlying the first composite film; and e) depositing a conductive top electrode overlying the ferroelectric material, whereby a ferroelectric capacitor is formed. As mentioned above, the disclosed Ir—M—O composite film is also suitable as the top electrode.

Sputtering is one PVD process used to deposit the composite and barrier films. When a four inch target is used, the first barrier material can be deposited by sputtering in Step a) at about 50 to 800 watts (W), in an Ar—$O_2$ atmosphere at a pressure of 2–100 millitorr (mT). Step b) can include cosputtering Ir and a metal targets with a power level in the range of approximately 50 to 800 watts. The metal targets are selected from the group of metals consisting of Ta, Ti, Nb, Zr, Al, and Nf. The atmosphere is Ar—$O_2$ in a ratio in the range if approximately 1:5 to 5:1, and the atmosphere pressure is in the range of approximately 2 to 100 mT. Alternately, Step b) includes depositing the first composite film through PVD deposition, sputtering with a single, composite source, in an oxygen environment. The single composite source material is selected from the group of materials consisting of Ir, Ta, Ti, Nb, Zr, Al, Hf, and oxides of the above-mentioned materials. When large targets are used, the sputtering power level for Steps a) and b) is about 2 to 20 kilowatts (kW).

In some aspects of the invention, the first barrier layer is formed in Step a) by depositing an oxidized refractory metal. Alternately, the refractory metal is deposited and, then, oxidized before the deposition of the first composite film. In a third alternative, refractory metal is deposited with the first composite film deposited over the refractory metal. Then, the overlying film are annealed in an oxygen environment so that the refractory metal of the first barrier is oxidized.

DETAILED DESCRIPTION OF THE PREFERRED EMBODIMENT

Figure 1:
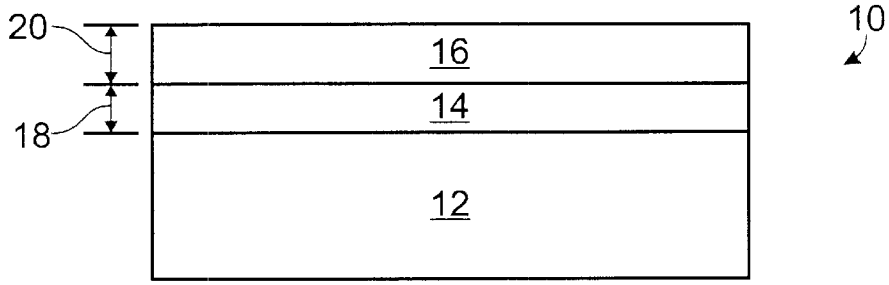
FIGS. 1–3 illustrate steps in a completed, highly temperature stable conductive barrier layer, for use in an integrated circuit.
Figure 2:
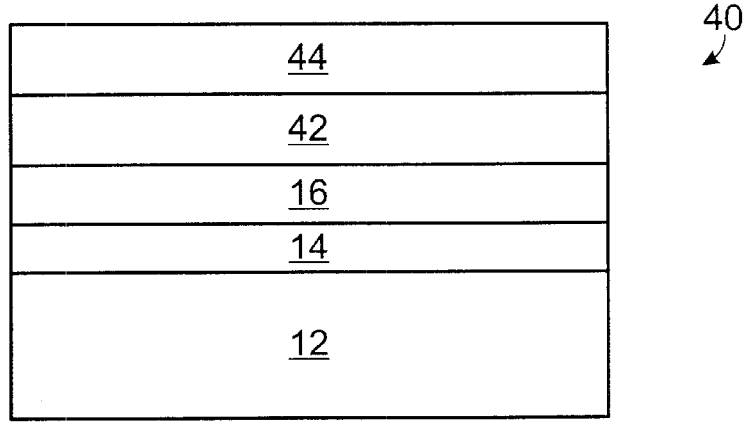
Figure 3:
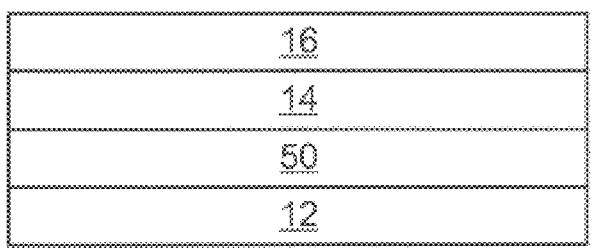

FIGS. 1–3 illustrate steps in a completed, highly temperature stable conductive barrier layer, for use in an integrated circuit. Specifically, the conductive barrier is useful as an electrode in a ferroelectric capacitor. FIG. 1 depicts conductive barrier 10 comprising a substrate 12, a first barrier film 14, including material selected from the group consisting of $TiO_2$, $Ta_2O_5$, $Nb_2O_5$, $ZrO_2$, $Al_2O_3$, and $HfO_2$, overlying substrate 12. A first composite film 16 including iridium and oxygen overlies first barrier film 14. First composite film 16 remains conductive after high temperature annealing processes in an oxygen environment.

Substrate 12 is selected from the group of materials consisting of silicon, polysilicon, silicon dioxide, and silicon-germanium compounds, whereby first barrier layer 14 prevents the formation of Ir silicide products. First barrier layer 14 has a thickness 18 in the range of approximately 2 to 100 nanometers (nm).

Specifically, several types of first composite film 16 are possible which include a transition metal, or refractory metal. Conductive barrier layer 10 includes first composite films 16 selected from the group consisting of Ir—Ta—O, Ir—Ti—O, Ir—Nb—O, Ir—Al—O, Ir—Zr—O, and Ir—Hf—O. The conductivity of the electrode layers can be varied by changing the relative composition ratio of metal, Ir, and O. Ir—M—O first composite film 16 has a thickness 20 in the range of approximately 10 to 500 nm. First composite film 16 and first barrier layer 14 typically include common materials selected from the group consisting of Ti, Nb, Zr, Al, and Hf. That is, when first composite film 16 includes Ti, first barrier layer 14 includes Ti. Likewise, when first composite film 16 includes Nb, so does first barrier layer 14. When first composite film 16 includes Zr, so does first barrier layer 14. When first composite film 16 includes Al, so does first barrier film 14. When first composite film 16 includes Hf, so does first barrier film 14. Alternately, the metal in film 16 and barrier 14 are different. For example, a barrier layer 14 including Ti and a composite film 16 of Ta.

FIG. 2 illustrates conductive barrier layer 10 of FIG. 1 included as part of a ferroelectric capacitor 40. Ferroelectric capacitor 40 further includes a ferroelectric film 42 overlying first composite film 16. A conductive metal film top electrode 44 overlies ferroelectric film 42. In some aspects of the invention, top electrode 44 is the same material as first composite film bottom electrode 16. In this manner, ferroelectric film 42 is capable of storing charges, or maintaining polarity, between top electrode 44 and bottom electrode 16.

Top electrode 44 is a noble metal, multilayered electrode, and one of the above-mentioned Ir composite films 16, in alternative aspects of the invention.

These structures include a conductive bottom electrode/barrier structures on silicon, polysilicon or silicon dioxide substrate in the nonvolatile memories, such as MFMIS (metal/ferro/metal/insulator/silicon) memories, DRAM, capacitors, sensors, displays, and transducer applications.

FIG. 3 illustrates barrier structure 10 with a gate dielectric. In some aspects of the invention when substrate 12 is silicon, structure 10 further comprises a silicon dioxide layer 50 interposed between substrate 12 and first barrier layer 14. Silicon dioxide layer 50 improves the interface between substrate 12 and overlying metal barriers 14 and 16.

The as-deposited Ir—M—O film 16 becomes most conductive with a post deposition annealing at 800–900° C. in $O_2$ ambient for 1–30 min. Thickness of the structure can be stabled by annealing at temperatures of 600° C., or greater.

The symbol "/", as used herein, defines a layering of films, so that Ir/Ta is a layer of Ir film overlying a Ta film. The symbol "–", as used herein, defines a combination or mixture of elements, so that a Ir—Ta film is a composite film which includes elements of Ir and Ta.

Figure 4:
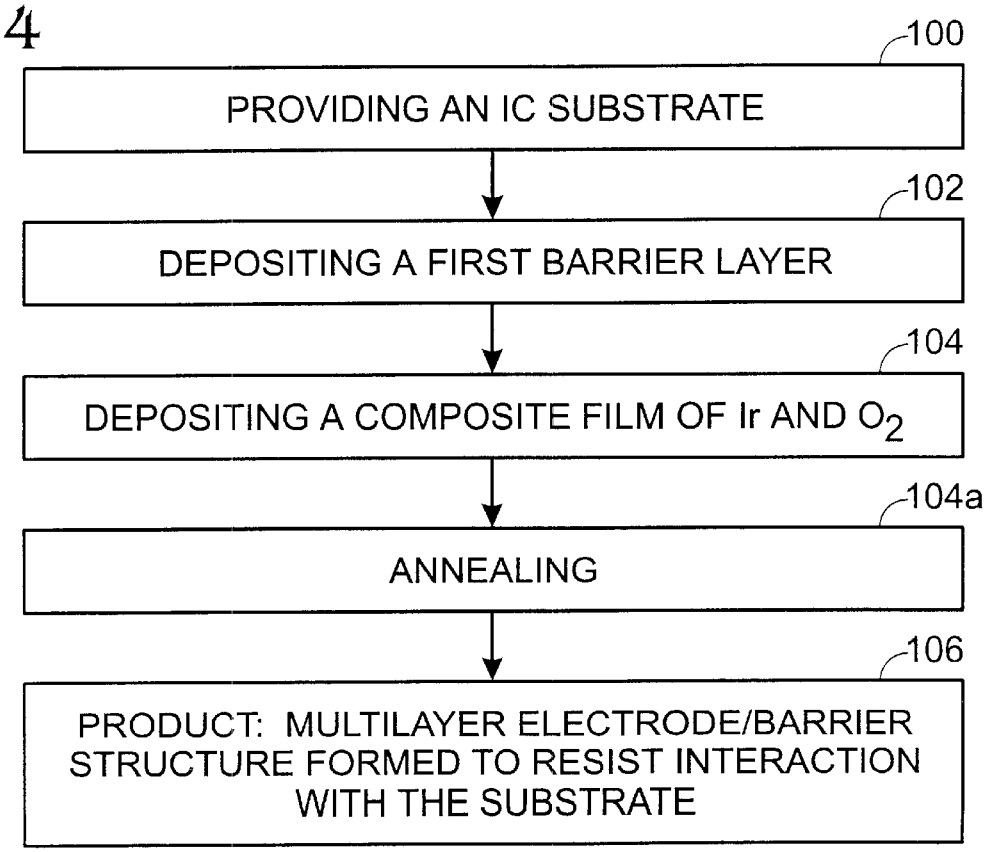
FIG. 4 is a flowchart illustrating steps in a method for forming a highly temperature stable conductive barrier layer, such as used in a ferroelectric capacitor.

FIG. 4 is a flowchart illustrating steps in a method for forming a highly temperature stable conductive barrier layer, such as used in a ferroelectric capacitor. Step 100 provides an integrated circuit substrate. The substrate is selected from the group of materials consisting of silicon, polysilicon, silicon dioxide, and silicon-germanium compounds. In some aspects of the invention (not shown), a step follows Step 100, and precedes Step 102. Step 100a includes using a silicon substrate and forming a layer of silicon dioxide over the silicon substrate having a thickness in the range of approximately 5 to 200 Å. The silicon dioxide layer improves the interface between the silicon and a subsequently deposited metal oxide barrier layer. The thickness of the silicon dioxide layer ranges from about 5 to 100 Å. The silicon dioxide layer permits the first barrier layer formed in Step 102 to be used as a gate dielectric, such as used in a MFMIS application. Alternative Step 100a processes are discussed below.

Step 102 forms a first barrier layer including material selected from the group consisting of $TiO_2$, $Ta_2O_5$, $Nb_2O_5$, $ZrO_2$, $Al_2O_3$, and $HfO_2$, overlying the substrate. Step 102 includes depositing the first barrier layer through deposition methods selected from the group consisting of CVD, PVD, and MOCVD. It is understood that PVD processes include both dc and RF (radio frequency) sputtering. In some aspects of the invention, Step 102 includes depositing the first barrier layer at approximately room temperature. Step 102 also includes depositing the first barrier layer to a thickness in the range of approximately 2 to 100 nm.

In some aspects of the invention, Step 102 includes depositing a refractory metal selected from the group consisting of Ta, Ti, Nb, Zr, and Hf. Then, in a step preceding Step 104 (not shown), the deposited metal is annealed in an oxygen atmosphere, oxidizing the metal of the first barrier layer. The annealing temperature is about 400 to 1000 degrees C., for a duration of about 1 to 120 minutes. Alternately, Step 102 includes depositing a metal oxide selected from the group $TiO_2$, $Ta_2O_5$, $Nb_2O_5$, $ZrO_2$, $Al_2O_3$, and $HfO_2$. When the substrate is silicon, a silicon dioxide layer is formed simultaneously (Step 100a) with Step 102, due to the oxygen atmosphere. In another alternative, Step 102 includes depositing a metal selected from the group consisting of Ta, Ti, Nb, Zr, and Hf. Step 102 includes a sub-step, following Step 104. Step 104a (not shown) anneals the deposited first barrier layer metal and first composite film in an oxygen environment to oxidize the first barrier layer. Specifically, the annealing temperature is about 400 to 1000 degrees C., for a duration of about 1 to 120 minutes. When the substrate is silicon, a silicon dioxide layer is formed simultaneously (Step 100a) with the annealment of Step 104a, due to the oxygen atmosphere.

Step 104 forms a first composite film of iridium and oxygen, with another metal, overlying the first barrier layer. Step 104 includes depositing the first composite film by deposition methods selected from the group consisting of PVD, CVD, and MOCVD. In some aspects of the invention, Step 104 includes forming the first composite film at approximately room temperature to a thickness in the range of approximately 10 to 500 nm. Step 104 includes the first composite film being selected from the group consisting of Ir—Ta—O, Ir—Ti—O, Ir—Nb—O, Ir—Al—O, Ir—Zr—O, Ir—Hf—O. Step 106 is a product, where a multilayer structure is formed that is resistive to interaction with the substrate.

Step 104a includes annealing the first composite film to improve the conductivity and to stabilize the first composite film thickness. The annealing is conducted in an atmosphere selected from the group consisting of $N_2$, $O_2$, Ar, and a vacuum, at an annealing temperature in the range between approximately 400 and 1000 degrees C., for a duration of time in the range of approximately 1 to 120 minutes. That is, the Ta, Ti, Nb, Zr, or Hf metal deposited in Step 102 is oxidized in the annealing step of Step 104a.

When sputtering is performed, Step 100 typically includes establishing a base, pre-process, pressure in less than $1 \times 10^{-5}$ and, preferably about $1 \times 10^{-7}$ T. In some aspects of the invention, Step 102 includes depositing the first barrier material by sputtering 4 inch targets at approximately 50 to 800 watts, in an atmosphere including Ar and $O_2$, at a pressure of about 2 to 100 mT. With larger targets, the power levels are in the range of about 2 to 20 kW.

In some aspects of the invention, Step 104 includes depositing the first composite film through PVD deposition. Specifically, dc cosputtering is used with separate Ir and metal targets. The sputtering is conducted in an atmosphere of Ar—$O_2$ in a ratio in the range of approximately 1:5 to 5:1. The pressure varies from approximately 2 to 100 mT. Separate Ir and metal oxide targets are RF sputtered, with the metal oxide target including a metal selected from the group consisting of Ta, Ti, Nb, Zr, Al, and Hf.

Further, Step 104 includes dc cosputtering separate Ir and metal 4 inch targets at a power in the range of approximately 50 to 800 watts. The metal targets are selected from the group consisting of Ta, Ti, Nb, Zr, Al, and Hf In general, dc sputtering is used when the targets are a conductive material, and RF sputtering is used when one of the targets is a nonconductive material. The above-mentioned power levels are used with 4 inch targets. When larger targets are used, such as an 11 or 13 inch target, the sputtering power levels of Steps 102 and 104 are in the range of approximately 2 to 20 kW. Alternately, the power is expressed as a current density in the range of approximately 10 to 100 milliamps per square centimeter, at a few hundred volts.

Alternately, Step 104 includes depositing the first composite film through PVD deposition using sputtering with a single composite source using a target of refractory metal material selected from the group consisting of Ir, Ta, Ti, Nb, Zr, Hf, and oxides of the above-mentioned refractory metal materials. Typically, the sputtering is conducted in an oxygen atmosphere, although an oxygen atmosphere is less important if the target material contains oxygen in the form of metal oxides.

In some aspects of the invention, Step 100a includes forming the $SiO_2$ layer by depositing a refractory metal selected from the group consisting of Ta, Ti, Nb, Zr, Al, or Hf in Step 102 and performing an annealing step in an oxygen atmosphere following Step 102. Step 100*a* occurs simultaneously with the refractory metal annealing step. Alternately, a refractory metal oxide selected from the group $TiO_2$, $Ta_2O_5$, $Nb_2O_5$, $ZrO_2$, $Al_2O_3$, and $HfO_2$, is deposited in Step 102. The oxygen atmosphere of the metal oxide deposition process simultaneously causes the Si substrate to oxidize in Step 100*a*.

Figure 5:
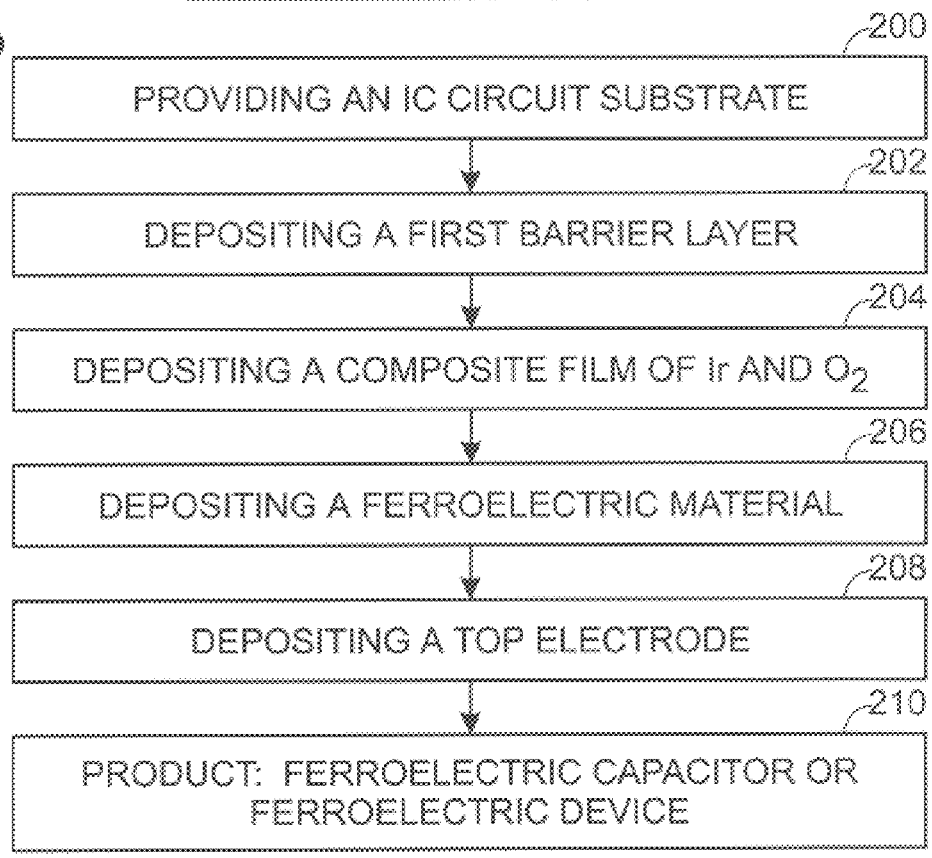
FIG. 5 is a flowchart depicting steps in the formation of a ferroelectric capacitor, using the conductive barrier Ir composite film of the present invention.

FIG. 5 is a flowchart depicting steps in the formation of a ferroelectric capacitor, using the conductive barrier first composite film of the present invention. Steps 200 through 204 replicate Steps 100 through 104 of FIG. 4. Step 206 deposits a ferroelectric material overlying the first composite layer. Step 208 forms a conductive metal film top electrode overlying the ferroelectric material. Step 210 is a product, where a ferroelectric capacitor is formed. When the top electrode material is an Ir—M—O film as the first composite film, a further step follows Step 208. Step 209 (not shown) anneals top electrode composite film to improve the conductivity and to stabilize the first composite film thickness. The annealing is conducted in an atmosphere selected from the group consisting of N2, O2, Ar, and a vacuum, at an annealing temperature in the range between approximately 400 and 1000 degrees C., for a duration of time in the range of approximately 1 to 120 minutes.

Figure 6:
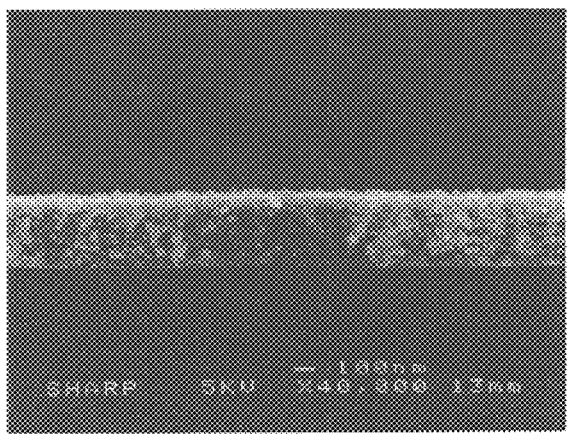
FIG. 6 is scanning electron microscope (SEM) cross-section of a present invention structure following annealing.

FIG. 6 is a scanning electron microscope (SEM) cross-section of a present invention structure following annealing. A Ir—Ta—O/Ta—$Ta_2O_5$/$SiO_2$ structure is shown after 800 degree C. annealing, for 90 minutes. The picture is presented to demonstrate the excellent film integrity. Further, the composite film remains conductive, with a sheet resistance of about 25 ohms per square. In fact, the sheet resistance actually decreases as a result of annealing, from the pre-annealing value of about 60 ohms per square.

An Ir—M—O composite film has been provided that is useful in forming an electrode of a ferroelectric capacitor. The composite film includes a variety of transition metal and oxygen, as well as iridium. The Ir—M—O composite film effectively resists oxygen diffusion to the substrate when a oxidized metal companion barrier is used, and is resistant to high temperature annealing in oxygen environments. When used with an underlying oxidized transition metal barrier layer, the resulting conductive barrier also suppresses to diffusion of Ir into any underlying Si substrates. As a result, Ir silicide products are not formed which degrade the electrode interface characteristics. The Ir composite film remains conductive, and resists peeling and hillock formation during high temperature annealing processes, even in an oxygen atmosphere. The above-mentioned Ir composite film is useful in the fabrication of nonvolatile memories, such as metal ferroelectric metal insulator silicon (MFMIS), DRAM, capacitors, pyroelectric infrared sensors, optical displays, and piezoelectric transducers. Additionally, the Ir composite film is useful in other high temperature oxidation environments. For example, in aerospace applications such a material used in the fabrication of rocket thrusters. Other variations and embodiments will occur to those skilled in the art.

What is claimed is:

1. In an integrated circuit, a highly temperature stable conductive barrier comprising:
   a substrate;
   a first barrier film, including a metal oxide selected from the group consisting of $TiO_2$, $Ta_2O_5$, $Nb_2O_5$, $ZrO_2$, $Al_2O_3$, and $HfO_2$ overlying said substrate; and
   a first composite film including iridium, oxygen, and a metal selected from the group consisting of Ti, Ta, Nb, Zr, Al, and Hf overlying said first barrier film.

2. A conductive barrier as in claim 1 in which said substrate is selected from the group of materials consisting of silicon, polysilicon, silicon dioxide, and silicon-germanium compounds, whereby said first barrier layer prevents the formation of Ir silicide products.

3. A conductive barrier as in claim 1 in which said first barrier layer has a thickness in the range of approximately 2 to 100 nanometers (nm).

4. A conductive barrier as in claim 1 in which said first composite film is selected from the Ir—Ta—O, Ir—Ti—O, Ir—Nb—O, Ir—Al—O, Ir—Zr—O, and Ir—Hf—O.

5. A conductive barrier as in claim 1 in which said first composite film and said first barrier layer include common material selected from a group of materials consisting of Ti, Nb, Zr, Al, and Hf.

6. A conductive barrier as in claim 1 in which said first composite film has a thickness in the range of approximately 10 to 500 nm.

7. A conductive baffler as in claim 1, wherein a ferroelectric capacitor is formed, farther comprising:
   a ferroelectric film overlying said first composite film; and
   a conductive metal film top electrode overlying said ferroelectric film, whereby a ferroelectric capacitor is formed, capable of storing charges between said first and second films.

8. A conductive barrier as in claim 7 in which said conductive metal film is an Ir and oxygen composite film also including a metal selected from a group of materials consisting of Ta, Ti, Nb, Zr, Al, and Hf.

9. A conductive barrier as in claim 2 wherein said substrate is silicon and further comprising:
   a silicon dioxide layer interposed between said substrate and said first barrier layer, whereby said silicon dioxide layer improves the interface between said substrate and overlying metal barriers.

10. In an integrated circuit, a highly temperature stable conductive barrier comprising:
    a substrate;
    a first barrier film, including a material selected from the group consisting of $TiO_2$, $Ta_2O_5$, $Nb_2O_5$, $ZrO_2$, $Al_2O_3$, and $HfO_2$, overlying said substrate;
    a first composite film including iridium, oxygen, and a metal selected from the group consisting of Ti, Ta, Nb, Zr, Al, and Hf overlying said first barrier film; and,
    wherein the first barrier film and the first composite film include a common metal.

* * * * *